(12) United States Patent
Kamoshida et al.

(10) Patent No.: US 6,950,361 B2
(45) Date of Patent: Sep. 27, 2005

(54) NONVOLATILE SEMICONDUCTOR MEMORY DEVICE USING FERROELECTRIC CAPACITOR

(75) Inventors: Masahiro Kamoshida, Yokohama (JP); Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/833,133

(22) Filed: Apr. 28, 2004

(65) Prior Publication Data

US 2005/0190621 A1 Sep. 1, 2005

(30) Foreign Application Priority Data

Feb. 27, 2004 (JP) .............................. 2004-053539

(51) Int. Cl.[7] .............................................. G11C 7/00
(52) U.S. Cl. ...................................... 365/203; 365/63
(58) Field of Search ............................... 365/203, 205, 365/63

(56) References Cited

U.S. PATENT DOCUMENTS 5,828,621 A * 10/1998 Tanzawa et al. ............ 365/229
6,188,608 B1 * 2/2001 Maruyama et al. ...... 365/185.2

FOREIGN PATENT DOCUMENTS

JP 10-255483 9/1998

OTHER PUBLICATIONS

T. Sumi, et al., ISSCC Digest of Technical Papers, pp. 268-269, "FA 16.2: A 256KB Nonvolatile Ferroelectric Memory at 3V and 100NS", Feb. 1994.
H. Koike, et al., IEEE Journal of Solid-State Circuits, vol. 31, No. 11, pp. 1625-1634, "A 60-NS 1-MB Nonvolatile Ferroelectric Memory with a Nondriven Cell Plate Line Write/Read Scheme", Nov. 1996.

* cited by examiner

*Primary Examiner*—Vu A. Le
(74) *Attorney, Agent, or Firm*—Oblon, Spivak, McClelland, Maier & Neustadt, P.C.

(57) ABSTRACT

A semiconductor memory device includes a sense amplifier, a pair of bit lines connected to the sense amplifier, first and second memory cell arrays connected to the bit lines, respectively, and including a plurality of memory cells each having a cell transistor and a ferroelectric capacitor, and first and second select transistors connected to the bit lines between the sense amplifier and the first and second memory cell arrays. The device further includes a first equalizing circuit connected to the bit lines closer to the first and second memory cell arrays than the first and second select transistors.

20 Claims, 6 Drawing Sheets

NONVOLATILE SEMICONDUCTOR MEMORY DEVICE USING FERROELECTRIC CAPACITOR

CROSS-REFERENCE TO RELATED APPLICATIONS

This application is based upon and claims the benefit of priority from prior Japanese Patent Application No. 2004-053539, filed Feb. 27, 2004, the entire contents of which are incorporated herein by reference.

BACKGROUND OF THE INVENTION

1. Field of the Invention

The present invention relates to a nonvolatile semiconductor memory device. More specifically, the invention relates to a ferroelectric random access memory (hereinafter referred to as FeRAM) that uses a ferroelectric capacitor.

2. Description of the Related Art

A FeRAM has recently been noted as one of semiconductor memory devices. The FeRAM is nonvolatile and has the advantages that the number of times of rewrite is $10^{12}$, the read and write time is almost equal to that of a dynamic RAM (DRAM), and the memory can operate at low voltage of 2.5 V to 5 V. With these advantages, the FeRAM may take the lion's share of the memory market. (See, for example, T. Sumi et al., "A 256 Kb Nonvolatile Ferroelectric Memory at 3 V and 100 ns," ISSCC Digest of Technical Papers, February, 1994, pp. 268 and 269 and H. Koike et al., "A 60-ns 1-Mb Nonvolatile Ferroelectric Memory with a Non-driven Cell Plate Line Write/Read Scheme," IEEE Journal of Solid State Circuit, Vol. 30, No. 11, November, 1996, pp. 1625 to 1634).

In the prior art FeRAM, burst mode, page mode and static column mode are essential for achievement of high-speed access. A time period for keeping the potential of a plate line high in these modes becomes longer than that in random access mode. The prior art FeRAM has the problem that a great load is applied to the ferroelectric capacitor in high-speed access mode.

BRIEF SUMMARY OF THE INVENTION

According to a first aspect of the present invention, there is provided a semiconductor memory device comprising: a sense amplifier; a pair of bit lines connected to the sense amplifier; first and second memory cell arrays connected to the bit lines, respectively, and including a plurality of memory cells each having a cell transistor and a ferroelectric capacitor; first and second select transistors connected to the bit lines between the sense amplifier and the first and second memory cell arrays; and a first equalizing circuit connected to the bit lines closer to the first and second memory cell arrays than the first and second select transistors.

According to a second aspect of the present invention, there is provided a semiconductor memory device comprising: a sense amplifier; a pair of bit lines connected to the sense amplifier; first and second memory cell arrays connected to the bit lines, respectively, and including blocks which have a plurality of memory cells, the memory cells including a cell transistor and a ferroelectric capacitor connected in parallel, one end of each of the blocks being connected to a corresponding one of the bit lines through a block select transistor, and another end of each of the blocks being connected to a plate line; first and second select transistors connected to the bit lines between the sense amplifier and the first and second memory cell arrays; and a first equalizing circuit connected to the bit lines closer to the first and second memory cell arrays than the first and second select transistors.

According to a third aspect of the present invention, there is provided a semiconductor memory device comprising: a sense amplifier; a pair of bit lines connected to the sense amplifier; first and second memory cell arrays connected to the bit lines, respectively, and including a plurality of memory cells, the memory cells including a cell transistor and a ferroelectric capacitor connected in series, one end of each of the memory cells being connected to a corresponding one of the bit lines and another end of each of the memory cells being connected to a plate line; first and second select transistors connected to the bit lines between the sense amplifier and the first and second memory cell arrays; and a first equalizing circuit connected to the bit lines closer to the first and second memory cell arrays than the first and second select transistors.

DETAILED DESCRIPTION OF THE INVENTION

Embodiments of the present invention will be described with reference to the accompanying drawings.

First Embodiment

Figure 1:
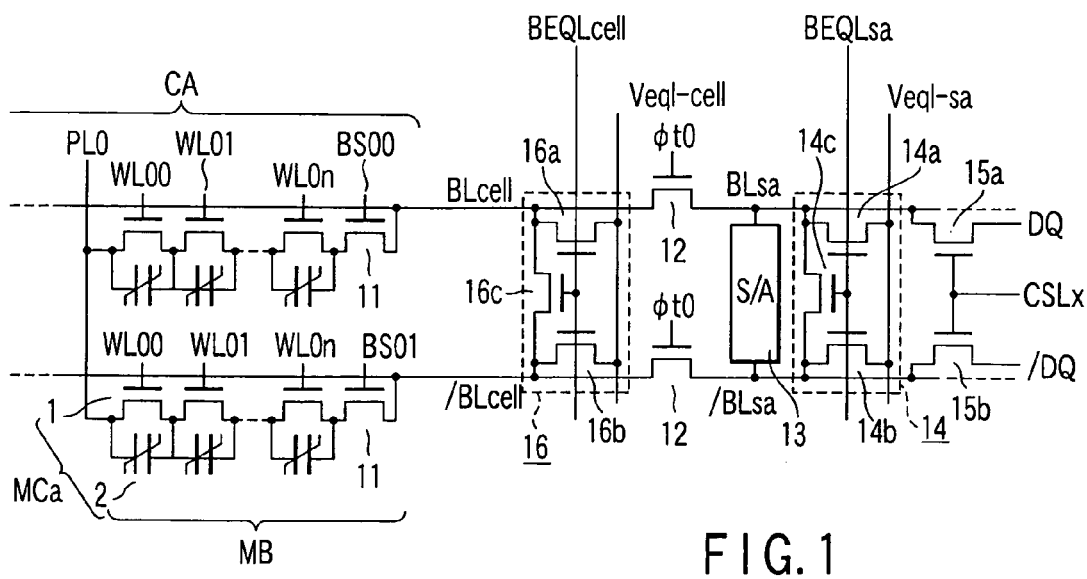
FIG. 1 is a circuit diagram showing an example of a FeRAM according to a first embodiment of the present invention.

FIG. 1 shows a basic arrangement of a FeRAM according to a first embodiment of the present invention. The FeRAM comprises a plurality of cell arrays CA each including a plurality of memory blocks MB. Each of the memory blocks MB has a TC parallel unit series connected ferroelectric memory. This memory is made up of a plurality of memory cells (cell units) MCa connected in series. Each of the memory cells MCa includes a cell transistor (T) 1 and a ferroelectric capacitor (C) 2 connected in parallel.

One end of each of the memory blocks MB is connected to one plate (electrode) line PL (PL0 in FIG. 1). The other end thereof are connected to one of bit lines BLcell and /BLcell, which are close to the cell array (CA), through a block select transistor 11. The bit lines BLcell and /BLcell are a pair of complementary signal lines. Block select signal lines BS (BS00 and BS01 in FIG. 1) are connected to their respective gates of block select transistors 11. Word lines WL (WL00, WL01, . . . , WL0n) are connected to their respective gates of cell transistors 1.

The bit lines BLcell and /BLcell are connected to bit lines BLsa and /BLsa, which are close to the sense amplifier (S/A), through bit line select transistors 12, respectively. The bit lines BLsa and /BLsa are a pair of complementary signal lines. A bit line select signal line φt (φt0 in FIG. 1) is connected to the gate of each of the bit line select transistors 12.

A sense amplifier 13 is connected to the bit lines BLsa and /BLsa. The drain of an n-type metal oxide semiconductor (MOS) transistor 14a is connected to the bit line BLsa. The source of the transistor 14a is connected to a signal line Veql-sa and the gate thereof is connected to a signal line BEQLsa. The drain of an n-type MOS transistor 14b is connected to the bit line /BLsa. The source of the transistor 14b is connected to the signal line Veql-sa and the gate thereof is connected to the signal line BEQLsa. The source and drain of an n-type MOS transistor 14c are connected to their corresponding bit lines BLsa and /BLsa. The gate of the transistor 14c is connected to the signal line BEQLsa. The MOS transistors 14a, 14b and 14c compose a second equalizing circuit 14.

The drains of n-type MOS transistors 15a and 15b are connected to their respective bit lines BLsa and /BLsa. A data line DQ is connected to the source of the transistor 15a and a data line /DQ is connected to the source of the transistor 15b. A column select signal line CSLx is connected to both the gates of the transistors 15a and 15b.

A first equalizing circuit 16 is connected to the bit lines BLcell and /BLcell closer to the cell array CA than the bit line select transistor 12. The drain of an n-type MOS transistor 16a is connected to the bit line BLcell. The source of the transistor 16a is connected to a signal line Veql-cell and the gate thereof is connected to a signal line BEQLcell. The drain of an n-type MOS transistor 16b is connected to the bit line /BLcell. The source of the transistor 16b is connected to the signal line Veql-cell and the gate thereof is connected to the signal line BEQLcell. The source and drain of an n-type MOS transistor 16c are connected to their corresponding bit lines BLcell and /BLcell. The gate of the transistor 16c is connected to the signal line BEQLcell. The MOS transistors 16a, 16b and 16c compose the first equalizing circuit 16.

A control circuit, not shown, controls the signal lines BEQLsa, BEQLcell, Veql-sa and Veql-cell.

Figure 2:
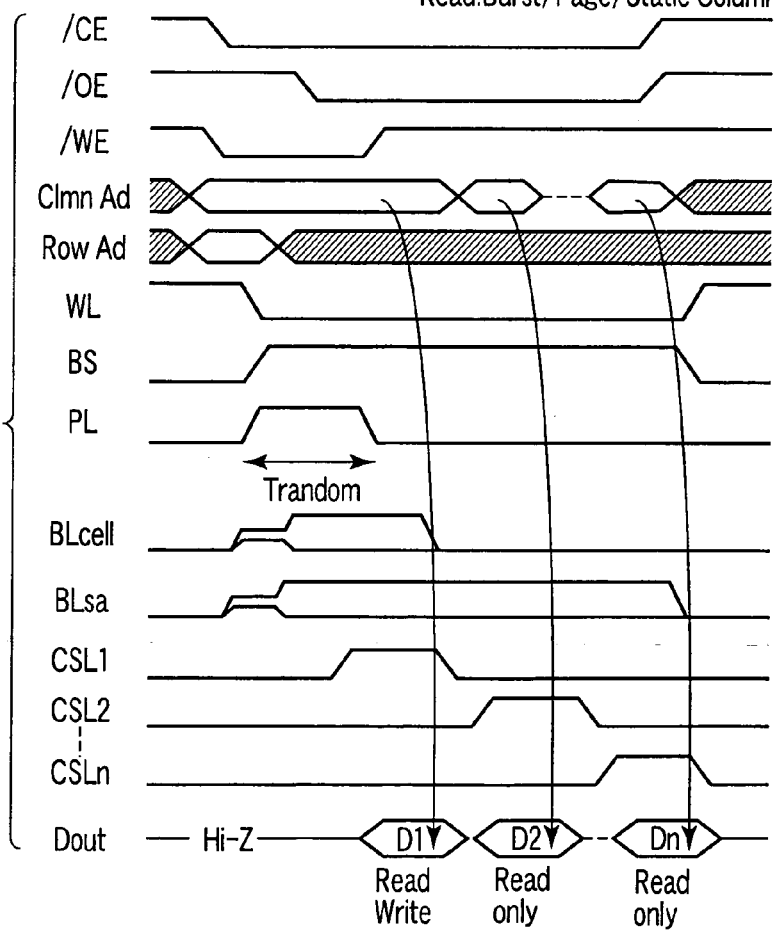
FIG. 2 is a chart showing an example of operation waveforms of the FeRAM shown in FIG. 1.

FIG. 2 shows operation waveforms of the FeRAM described above. The FeRAM reads data when a chip enable signal /CE is low and so is an output enable signal /OE. It reads a row address Row Ad once and a column address Clmn Ad continuously. If the potential of word line WL becomes low and the block select signal BS becomes high, access can be gained to a desired cell MCa.

Data is read out of the ferroelectric capacitor 2 by setting the potential of the plate line PL high while the potentials of bit lines BLcell and /BLcell are equalized to a low level. The read data is amplified by the sense amplifier 13 and the bit line select signal line φt is set low. Thus, the bit lines BLcell and /BLcell close to the cell array CA are separated from the bit lines BLsa and /BLsa close to the sense amplifier. After that, the first equalizing circuit 16 equalizes the potentials of bit lines BLcell and /BLcell to a low level.

A time period (Trandom in FIG. 2) for setting the potential of plate line PL high in burst mode is almost equal to a time period for setting the potential of plate line PL high in random access mode. As compared with the prior art FeRAM, the time period for setting the potential of plate line PL high in burst mode is shortened and a load applied to the ferroelectric capacitor 2 can be reduced.

The bit lines BLcell and /BLcell close to the cell array CA and the bit lines BLsa and /BLsa close to the sense amplifier do not conduct to each other. Even though the potentials of bit lines BLcell and /BLcell are equalized to a low level, the bit lines BLsa and /BLsa can hold the read data. In other words, if the column select signal lines CSLx (x=1, 2, . . . , n) corresponding to the column address are set high in sequence, the held data can be read out of the bit lines BLsa and /BLsa connected to the sense amplifier 13.

The above method is not applied to a high-speed write operation but effective only in a high-speed read operation.

Figure 3:
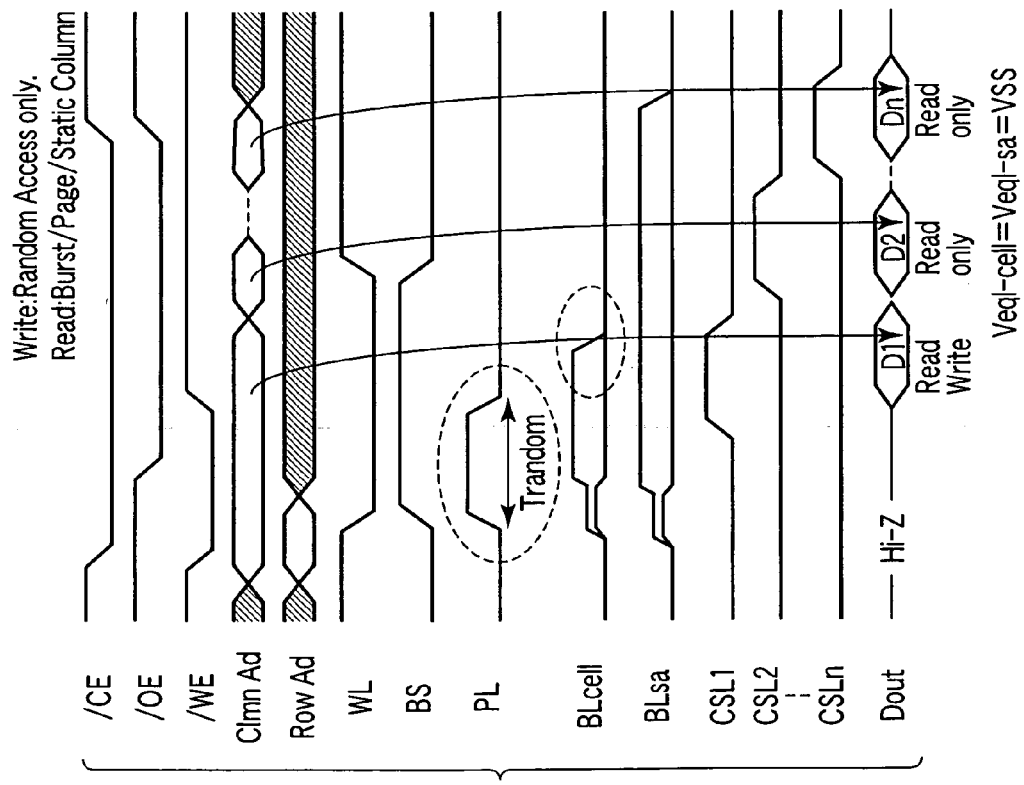
FIG. 3 is a chart showing another example of operation waveforms of the FeRAM shown in FIG. 1.

The FeRAM can perform the same operation if the time periods for setting the potential of word line WL low and setting the block select signal BS high can be made shorter than those in FIG. 2, as shown in FIG. 3.

Figure 4:
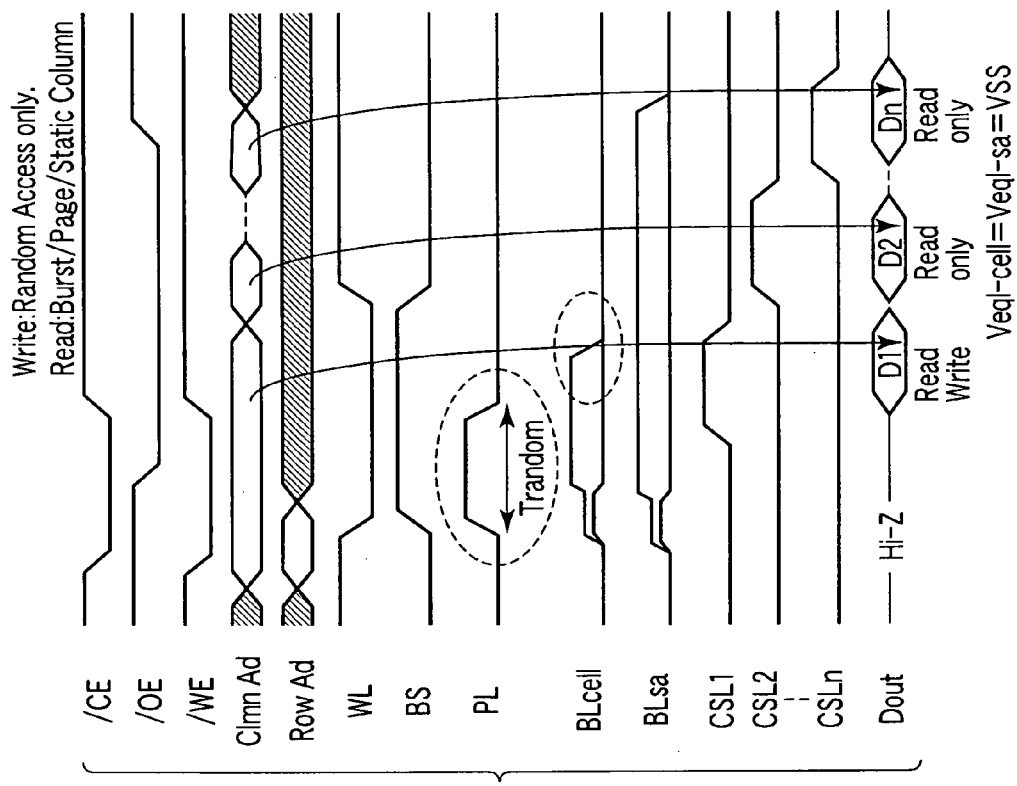
FIG. 4 is a chart showing still another example of operation waveforms of the FeRAM shown in FIG. 1.

The FeRAM can also perform the same operation if the time periods for setting the potential of word line WL low and setting the block select signal BS high can be made shorter than those in FIG. 2 and so can be a time period for setting the chip enable signal /CE low, as shown in FIG. 4.

Figure 5:
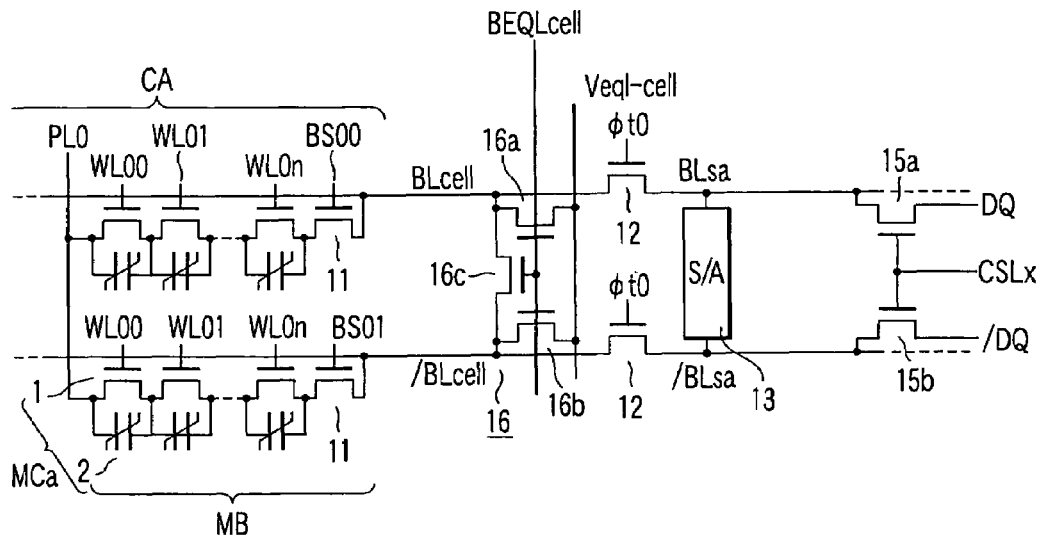
FIG. 5 is a circuit diagram showing another example of the FeRAM shown in FIG. 1.

The FeRAM can be configured to delete the equalizing circuit 14 close to the sense amplifier as shown in FIG. 5. FIGS. 2, 3 and 4 show the operation waveforms of this FeRAM.

Second Embodiment

Figure 6:
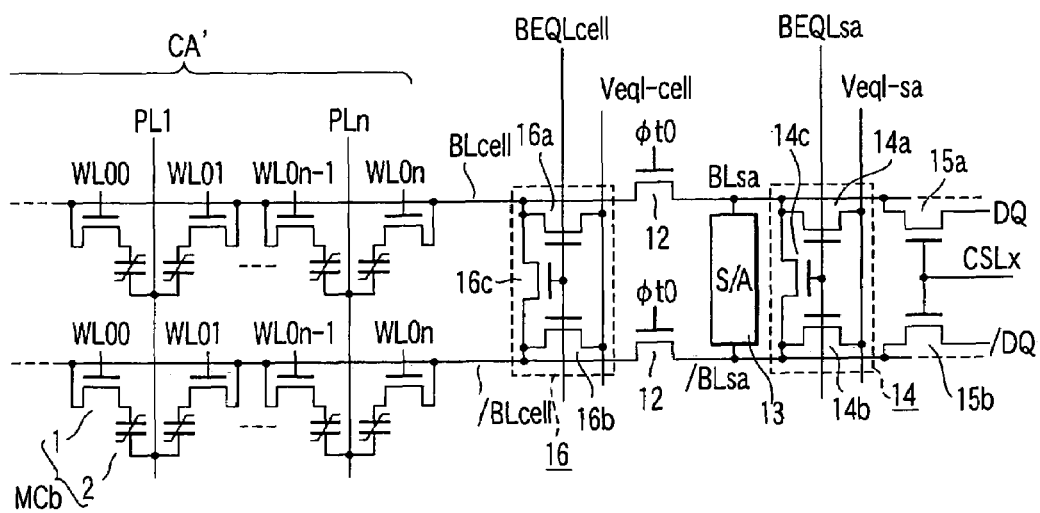
FIG. 6 is a circuit diagram showing an example of a FeRAM according to a second embodiment of the present invention.

FIG. 6 illustrates a basic arrangement of a FeRAM according to a second embodiment of the present invention. The FeRAM comprises a plurality of cell arrays CA' each including a plurality of memory cells (cell units) MCb. Each of the memory cells MCb has a cell transistor (T) 1 and a ferroelectric capacitor (C) 2 connected in series. One end of the ferroelectric capacitor 2 is connected to its corresponding one of plate lines PL (PL1 to PLn in FIG. 6). The other end thereof is connected to one of bit lines BLcell and /BLcell, which are close to the cell arrays CA', through a cell transistor 1. The bit lines BLcell and /BLcell are a pair of complementary signal lines. Word lines WL (WL00, WL01, . . . , WL0n) are connected to their respective gates of cell transistors 1.

The bit lines BLcell and /BLcell are connected to bit lines BLsa and /BLsa, which are close to the sense amplifier (S/A), through bit line select transistors 12, respectively. The bit lines BLsa and /BLsa are a pair of complementary signal lines. A bit line select signal line φt (φt0 in FIG. 1) is connected to the gate of each of the bit line select transistors 12.

A sense amplifier 13 is connected to the bit lines BLsa and /BLsa. The drain of an n-type MOS transistor 14a is connected to the bit line BLsa. The source of the transistor 14a is connected to a signal line Veql-sa and the gate thereof is connected to a signal line BEQLsa. The drain of an n-type MOS transistor 14b is connected to the bit line /BLsa. The source of the transistor 14b is connected to the signal line Veql-sa and the gate thereof is connected to the signal line BEQLsa. The source and drain of an n-type MOS transistor 14c are connected to their corresponding bit lines BLsa and /BLsa. The gate of the transistor 14c is connected to the signal line BEQLsa. The MOS transistors 14a, 14b and 14c compose a second equalizing circuit 14.

The drains of n-type MOS transistors 15a and 15b are connected to their respective bit lines BLsa and /BLsa. A data line DQ is connected to the source of the transistor 15a and a data line /DQ is connected to the source of the transistor 15b. A column select signal line CSLx is connected to both the gates of the transistors 15a and 15b.

A first equalizing circuit 16 is connected to the bit lines BLcell and /BLcell closer to the cell array CA' than the bit line select transistor 12. The drain of an n-type MOS transistor 16a is connected to the bit line BLcell. The source of the transistor 16a is connected to a signal line Veql-cell and the gate thereof is connected to a signal line BEQLcell. The drain of an n-type MOS transistor 16b is connected to the bit line /BLcell. The source of the transistor 16b is connected to the signal line Veql-cell and the gate thereof is connected to the signal line BEQLcell. The source and drain of an n-type MOS transistor 16c are connected to their corresponding bit lines BLcell and /BLcell. The gate of the transistor 16c is connected to the signal line BEQLcell. The MOS transistors 16a, 16b and 16c compose the first equalizing circuit 16.

A control circuit, not shown, controls the signal lines BEQLsa, BEQLcell, Veql-sa and Veql-cell.

Figure 7:
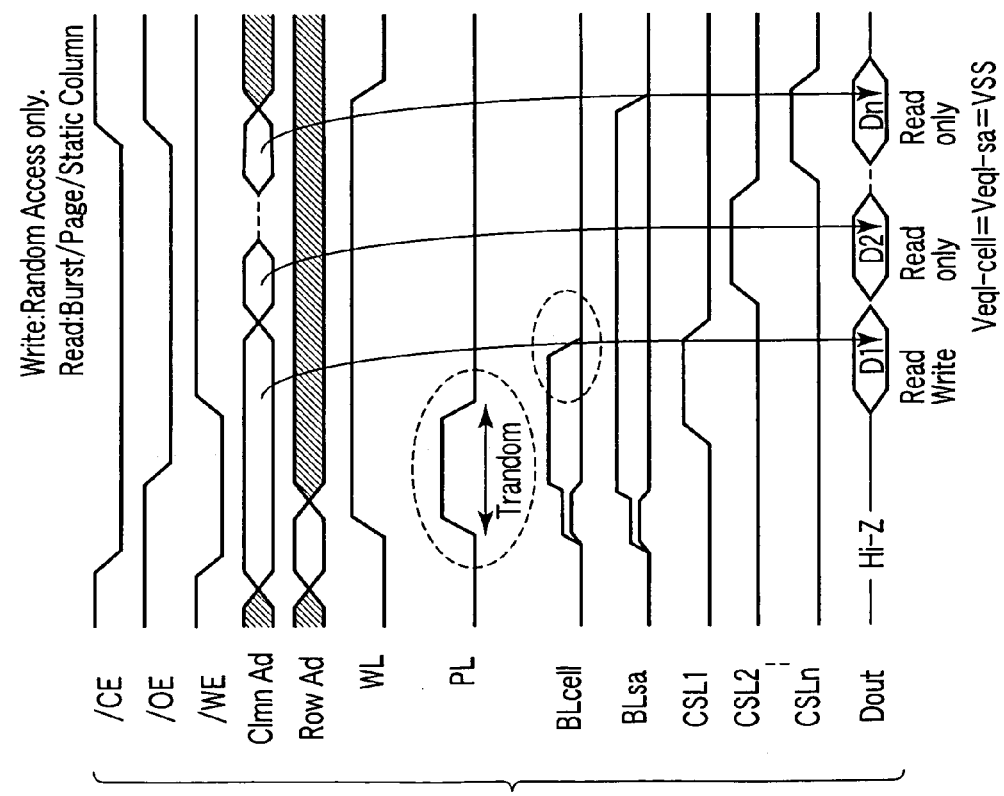
FIG. 7 is a chart showing an example of operation waveforms of the FeRAM shown in FIG. 6.

FIG. 7 shows operation waveforms of the FeRAM described above. The FeRAM reads data when a chip enable signal /CE is low and so is an output enable signal /OE. It reads a row address Row Ad once and a column address Clmn Ad continuously. If the potential of word line WL becomes high, access can be gained to a desired cell MCb.

Data is read out of the ferroelectric capacitor 2 by setting the potential of the plate line PL high while the potentials of bit lines BLcell and /BLcell are equalized to a low level. The read data is amplified by the sense amplifier 13 and the bit line select signal line φt is set low. Thus, the bit lines BLcell and /BLcell close to the cell array CA' are separated from the bit lines BLsa and /BLsa close to the sense amplifier. After that, the first equalizing circuit 16 equalizes the potentials of bit lines BLcell and /BLcell to a low level.

A time period (Trandom in FIG. 7) for setting the potential of plate line PL high in burst mode is almost equal to a time period for setting the potential of plate line PL high in random access mode. As compared with the prior art FeRAM, the time period for setting the potential of plate line PL high in burst mode is shortened and a load applied to the ferroelectric capacitor 2 can be reduced.

The bit lines BLcell and /BLcell close to the cell array CA' and the bit lines BLsa and /BLsa close to the sense amplifier do not conduct to each other. Even though the potentials of bit lines BLcell and /BLcell are equalized to a low level, the bit lines BLsa and /BLsa can hold the read data. In other words, if the column select signal lines CSLx (x=1, 2, . . . , n) corresponding to the column address are set high in sequence, the held data can be read out of the bit lines BLsa and /BLsa connected to the sense amplifier 13.

The above method is not applied to a high-speed write operation but effective only in a high-speed read operation.

Figure 8:
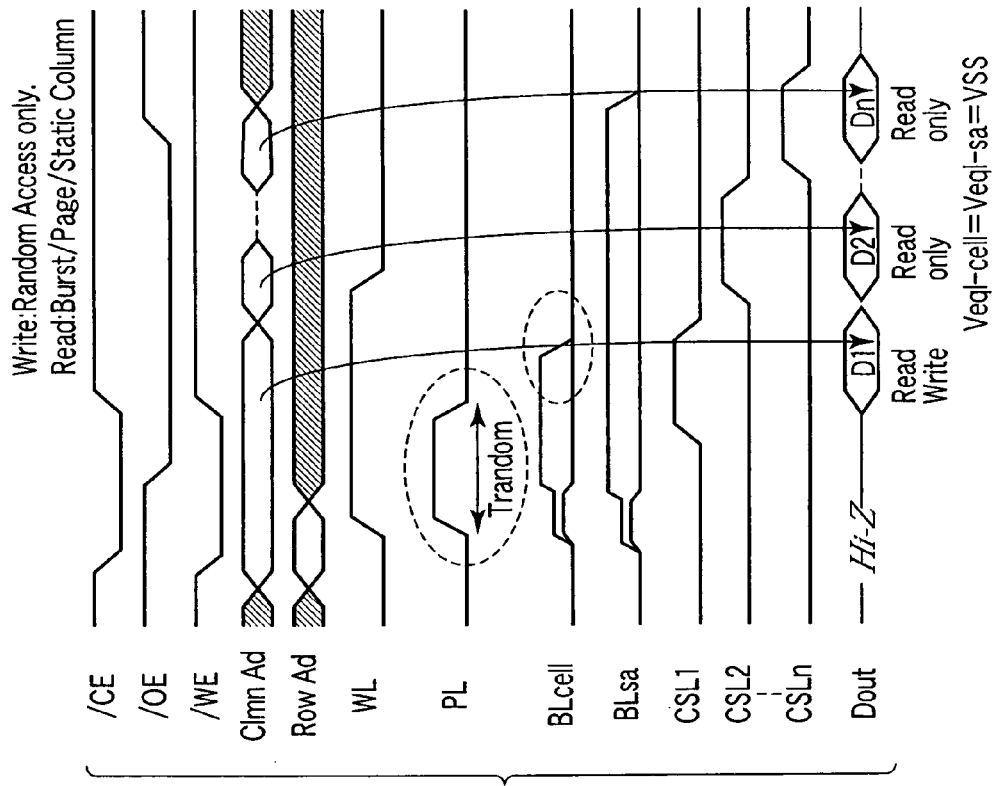
FIG. 8 is a chart showing another example of operation waveforms of the FeRAM shown in FIG. 6.

The FeRAM can perform the same operation if the time period for setting the potential of word line WL high can be made shorter than that in FIG. 7 and so can be a time period for setting the chip enable signal /CE low, as shown in FIG. 8.

Figure 9:
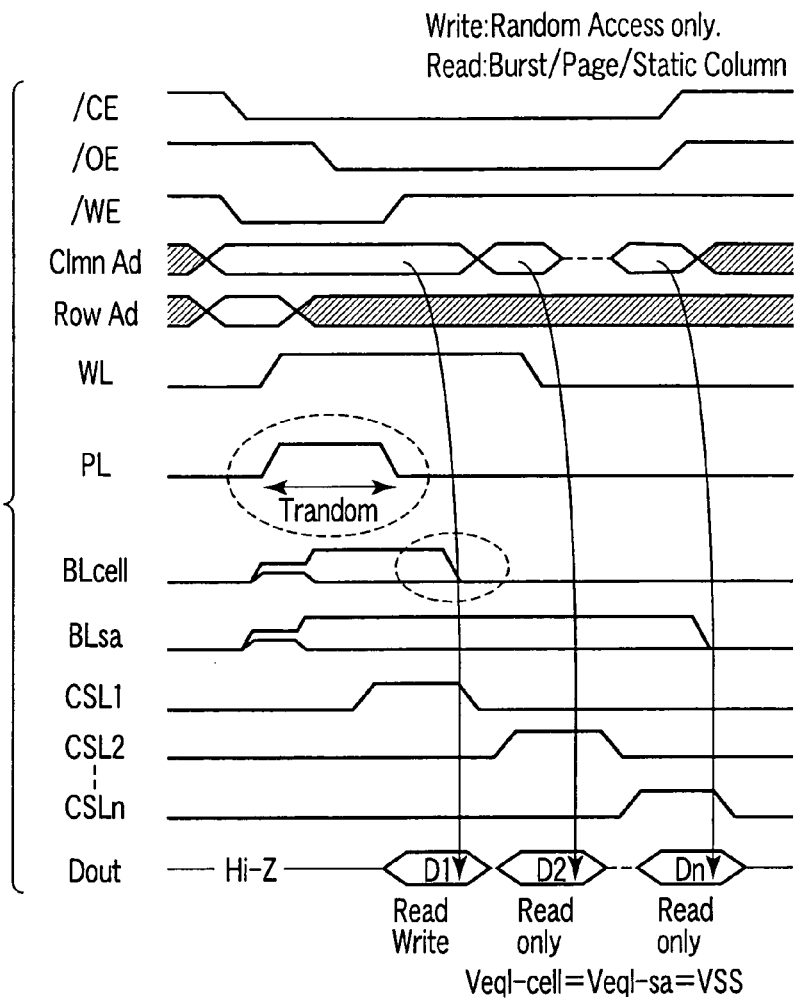
FIG. 9 is a chart showing still another example of operation waveforms of the FeRAM shown in FIG. 6.

The FeRAM can also perform the same operation if the time period for setting the potential of word line WL high can be made shorter than that in FIG. 7, as shown in FIG. 9.

Figure 10:
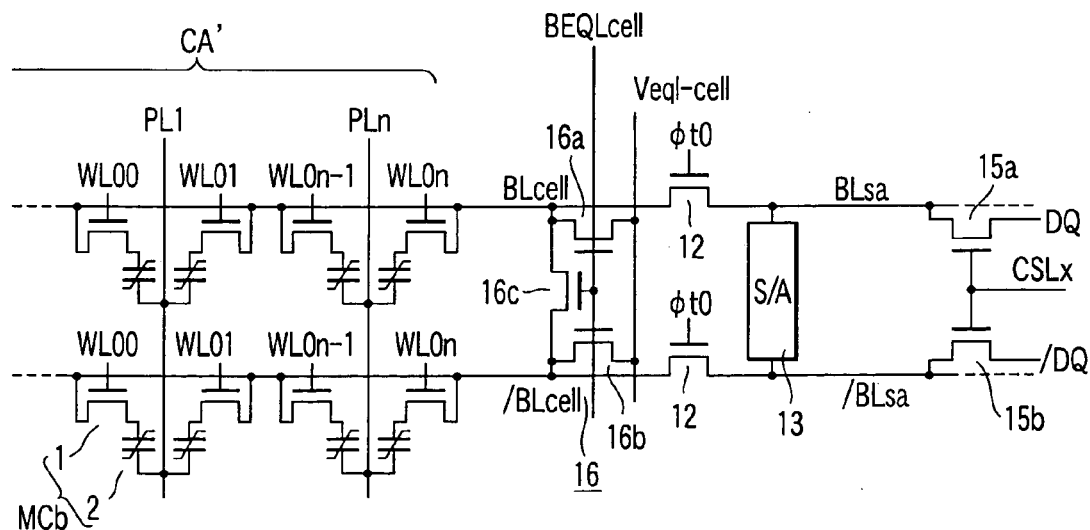
FIG. 10 is a circuit diagram showing another example of the FeRAM shown in FIG. 6.

The FeRAM can be configured to delete the second equalizing circuit 14 close to the sense amplifier as shown in FIG. 10. FIGS. 7, 8 and 9 show the operation waveforms of this FeRAM.

Figure 11:
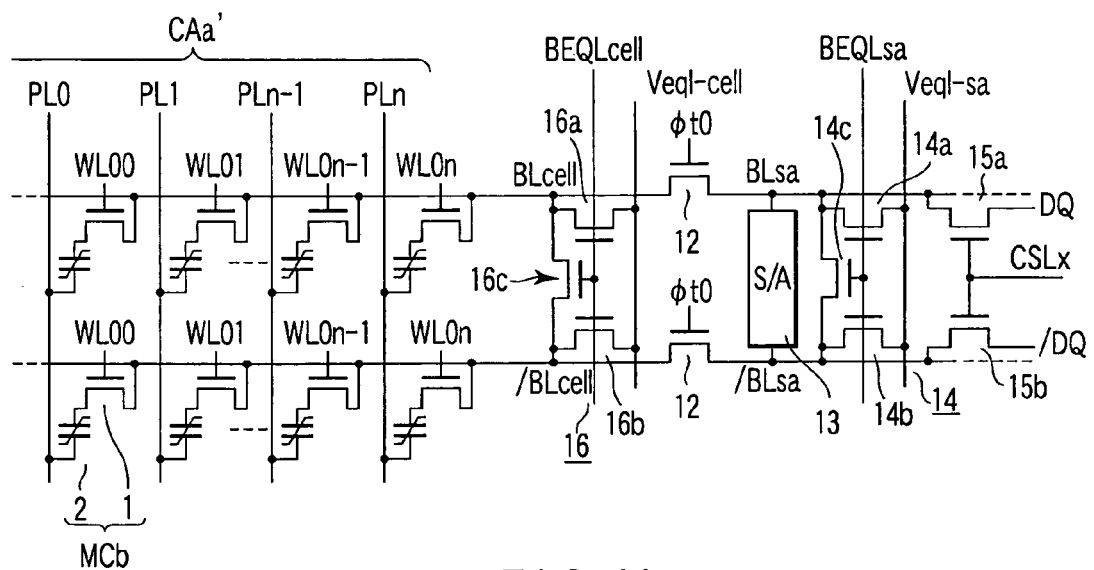
FIG. 11 is a circuit diagram showing still another example of the FeRAM shown in FIG. 6.

In the FeRAM shown in FIG. 6, the plate lines PL1 to PLn are shared between adjacent memory cells MCb. The embodiment is not limited to this. For example, a cell array CAa' can be so configured that plate lines PL0 to PLn are not shared between adjacent memory cells MCb as shown in FIG. 11.

Figure 12:
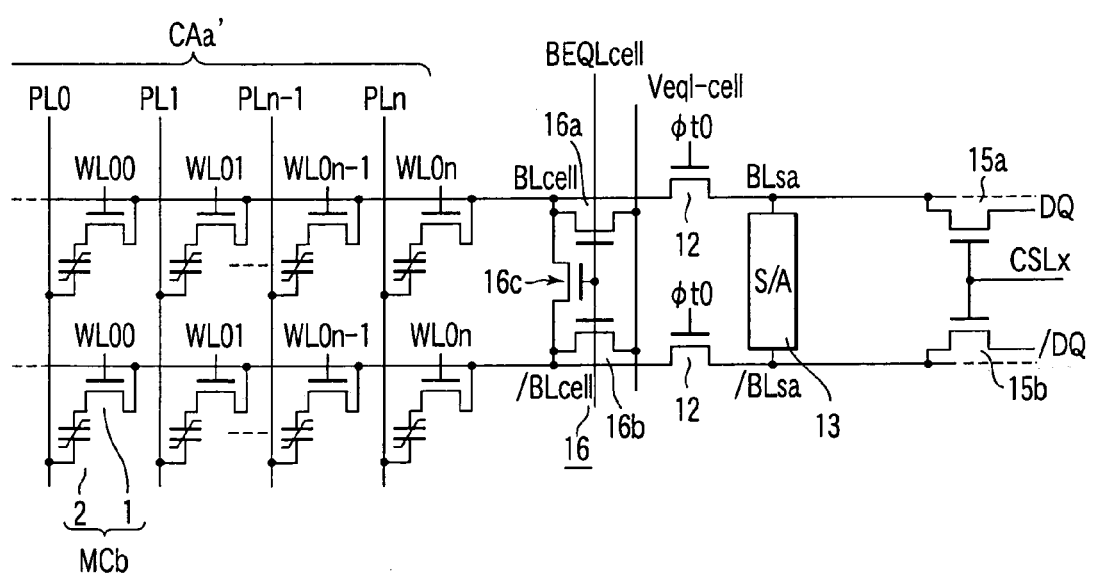
FIG. 12 is a circuit diagram showing another example of the FeRAM shown in FIG. 10.

Similarly, the embodiment is not limited to the FeRAM shown in FIG. 10 from which the second equalizing circuit 14 is deleted. The FeRAM can be so configured that plate lines PL0 to PLn are not shared between adjacent memory cells MCb in the cell array CAa' as shown in FIG. 12.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a sense amplifier;
   a pair of bit lines connected to the sense amplifier;
   first and second memory cell arrays connected to the bit lines, respectively, and including a plurality of memory cells each having a cell transistor and a ferroelectric capacitor;
   first and second select transistors connected to the bit lines between the sense amplifier and the first and second memory cell arrays; and
   a first equalizing circuit connected to the bit lines closer to the first and second memory cell arrays than the first and second select transistors.

2. The semiconductor memory device according to claim 1, further comprising a second equalizing circuit connected to the bit lines closer to the sense amplifier than the first and second select transistors.

3. The semiconductor memory device according to claim 1, wherein the first and second memory cell arrays include blocks which have the memory cells, and the memory cells include the ferroelectric capacitor and the cell transistor connected in parallel,
   one end of each of the blocks being connected to a corresponding one of the bit lines through a block select transistor, and another end of each of the blocks being connected to a plate line.

4. The semiconductor memory device according to claim 3, wherein a time period which keeps a potential of the plate line high in high-speed access mode is equal to that in random access mode.

5. The semiconductor memory device according to claim 1, wherein the first and second memory cell arrays include the memory cells, and the memory cells include the ferroelectric capacitor and the cell transistor connected in series,
   one end of each of the memory cells being connected to a corresponding one of the bit lines and another end of each of the memory cells being connected to a plate line.

6. The semiconductor memory device according to claim 5, wherein other ends of adjacent two of the memory cells are connected to one plate line.

7. The semiconductor memory device according to claim 5, wherein a time period which keeps a potential of the plate line high in high-speed access mode is equal to that in random access mode.

8. The semiconductor memory device according to claim 1, wherein a time period which equalizes a potential of the bit lines closer to the first and second memory cell arrays than the first and second select transistors in high-speed access mode is equal to a time period which equalizes a potential of the bit lines closer to the first and second memory cell arrays than the first and second select transistors in random access mode.

9. The semiconductor memory device according to claim 1, which holds a potential of the bit lines closer to the sense amplifier than the first and second select transistors in high-speed access mode.

10. A semiconductor memory device comprising:
a sense amplifier;
a pair of bit lines connected to the sense amplifier;
first and second memory cell arrays connected to the bit lines, respectively, and including blocks which have a plurality of memory cells, the memory cells including a cell transistor and a ferroelectric capacitor connected in parallel, one end of each of the blocks being connected to a corresponding one of the bit lines through a block select transistor, and another end of each of the blocks being connected to a plate line;
first and second select transistors connected to the bit lines between the sense amplifier and the first and second memory cell arrays; and
a first equalizing circuit connected to the bit lines closer to the first and second memory cell arrays than the first and second select transistors.

11. The semiconductor memory device according to claim 10, further comprising a second equalizing circuit connected to the bit lines closer to the sense amplifier than the first and second select transistors.

12. The semiconductor memory device according to claim 10, wherein a time period which keeps a potential of the plate line high in high-speed access mode is equal to that in random access mode.

13. The semiconductor memory device according to claim 10, wherein a time period which equalizes a potential of the bit lines closer to the first and second memory cell arrays than the first and second select transistors by the first equalizing circuit in high-speed access mode is equal to a time period which equalizes a potential of the bit lines closer to the first and second memory cell arrays than the first and second select transistors by the first equalizing circuit in random access mode.

14. The semiconductor memory device according to claim 10, which holds a potential of the bit lines closer to the sense amplifier than the first and second select transistors in high-speed access mode.

15. A semiconductor memory device comprising:
a sense amplifier;
a pair of bit lines connected to the sense amplifier;
first and second memory cell arrays connected to the bit lines, respectively, and including a plurality of memory cells, the memory cells including a cell transistor and a ferroelectric capacitor connected in series, one end of each of the memory cells being connected to a corresponding one of the bit lines and another end of each of the memory cells being connected to a plate line;
first and second select transistors connected to the bit lines between the sense amplifier and the first and second memory cell arrays; and
a first equalizing circuit connected to the bit lines closer to the first and second memory cell arrays than the first and second select transistors.

16. The semiconductor memory device according to claim 15, further comprising a second equalizing circuit connected to the bit lines closer to the sense amplifier than the first and second select transistors.

17. The semiconductor memory device according to claim 15, wherein other ends of adjacent two of the memory cells are connected to one plate line.

18. The semiconductor memory device according to claim 15, wherein a time period which keeps a potential of the plate line high in high-speed access mode is equal to that in random access mode.

19. The semiconductor memory device according to claim 15, wherein a time period which equalizes a potential of the bit lines closer to the first and second memory cell arrays than the first and second select transistors by the first equalizing circuit in high-speed access mode is equal to a time period which equalizes a potential of the bit lines closer to the first and second memory cell arrays than the first and second select transistors by the first equalizing circuit in random access mode.

20. The semiconductor memory device according to claim 15, which holds a potential of the bit lines closer to the sense amplifier than the first and second select transistors in high-speed access mode.

* * * * *